(12) United States Patent
Miyake

(10) Patent No.: US 8,319,585 B2
(45) Date of Patent: Nov. 27, 2012

(54) ELASTIC WAVE FILTER DEVICE AND MODULE INCLUDING THE SAME

(75) Inventor: Takashi Miyake, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/086,417

(22) Filed: Apr. 14, 2011

(65) Prior Publication Data

US 2011/0193654 A1    Aug. 11, 2011

Related U.S. Application Data

(63) Continuation of application No. PCT/JP2009/065933, filed on Sep. 11, 2009.

(30) Foreign Application Priority Data

Nov. 4, 2008   (JP) ................................. 2008-283104

(51) Int. Cl.
   *H03H 9/64* (2006.01)
(52) U.S. Cl. ....................................... 333/193; 333/195
(58) Field of Classification Search .......... 333/193–196; 310/313 R, 313 B, 313 C, 313 D
   See application file for complete search history.

(56) References Cited

U.S. PATENT DOCUMENTS

| | | | |
|---|---|---|---|
| 5,243,249 A | | 9/1993 | Miyashita et al. |
| 5,506,552 A | | 4/1996 | Seki et al. |
| 5,521,453 A | | 5/1996 | Yatsuda |
| 5,592,135 A | | 1/1997 | Taguchi et al. |
| 5,717,367 A | * | 2/1998 | Murai ............................ 333/195 |
| 5,770,985 A | * | 6/1998 | Ushiroku et al. ............. 333/193 |
| 5,864,262 A | * | 1/1999 | Ikada ............................. 333/193 |
| 5,914,646 A | | 6/1999 | Hashimoto |
| 6,483,402 B2 | * | 11/2002 | Endoh et al. .................. 333/193 |
| 6,700,460 B2 | * | 3/2004 | Takamine ...................... 333/195 |
| 6,759,928 B2 | * | 7/2004 | Endou et al. .................. 333/193 |
| 6,798,318 B1 | * | 9/2004 | Abbott et al. ................. 333/195 |
| 6,816,036 B2 | * | 11/2004 | Takamine ...................... 333/195 |
| 6,946,929 B2 | | 9/2005 | Ikeda et al. |

(Continued)

FOREIGN PATENT DOCUMENTS

JP        03-293808 A     12/1991

(Continued)

OTHER PUBLICATIONS

Official Communication issued in International Patent Application No. PCT/JP2009/065933, mailed on Oct. 20, 2009.

*Primary Examiner* — Barbara Summons
(74) *Attorney, Agent, or Firm* — Keating & Bennett, LLP

(57) ABSTRACT

An elastic wave filter device in which elastic wave filters and parallel resonators are provided on a piezoelectric substrate includes a plurality of ground ports. The elastic wave filters include input-side resonators and output-side resonators. The input-side resonators are connected between a reception input port and a first one of the ground ports. The output-side resonators are connected between reception output ports and the first ground port. The parallel resonators are connected in parallel to output lines and are connected to second and third ground ports.

3 Claims, 8 Drawing Sheets

U.S. PATENT DOCUMENTS

| | | | |
|---|---|---|---|
| 6,967,427 B2* | 11/2005 | Yata | 310/313 D |
| 2004/0075511 A1* | 4/2004 | Inoue et al. | 333/133 |
| 2004/0075513 A1* | 4/2004 | Ikeda et al. | 333/193 |
| 2004/0196119 A1* | 10/2004 | Shibahara et al. | 333/193 |
| 2004/0233019 A1* | 11/2004 | Inoue et al. | 333/193 |
| 2006/0091977 A1* | 5/2006 | Inoue et al. | 333/133 |
| 2007/0018756 A1* | 1/2007 | Fujii et al. | 333/193 |
| 2007/0296521 A1 | 12/2007 | Schmidhammer | |
| 2008/0204167 A1 | 8/2008 | Takamine | |
| 2008/0266023 A1* | 10/2008 | Tanaka | 333/133 |

FOREIGN PATENT DOCUMENTS

| | | |
|---|---|---|
| JP | 07-131290 A | 5/1995 |
| JP | 07-176979 A | 7/1995 |
| JP | 07-212183 A | 8/1995 |
| JP | 07-264000 A | 10/1995 |
| JP | 08-330880 A | 12/1996 |
| JP | 09-321569 A | 12/1997 |
| JP | 2000-261285 A | 9/2000 |
| WO | 2006/002720 A1 | 1/2006 |
| WO | 2007/055077 A1 | 5/2007 |

* cited by examiner

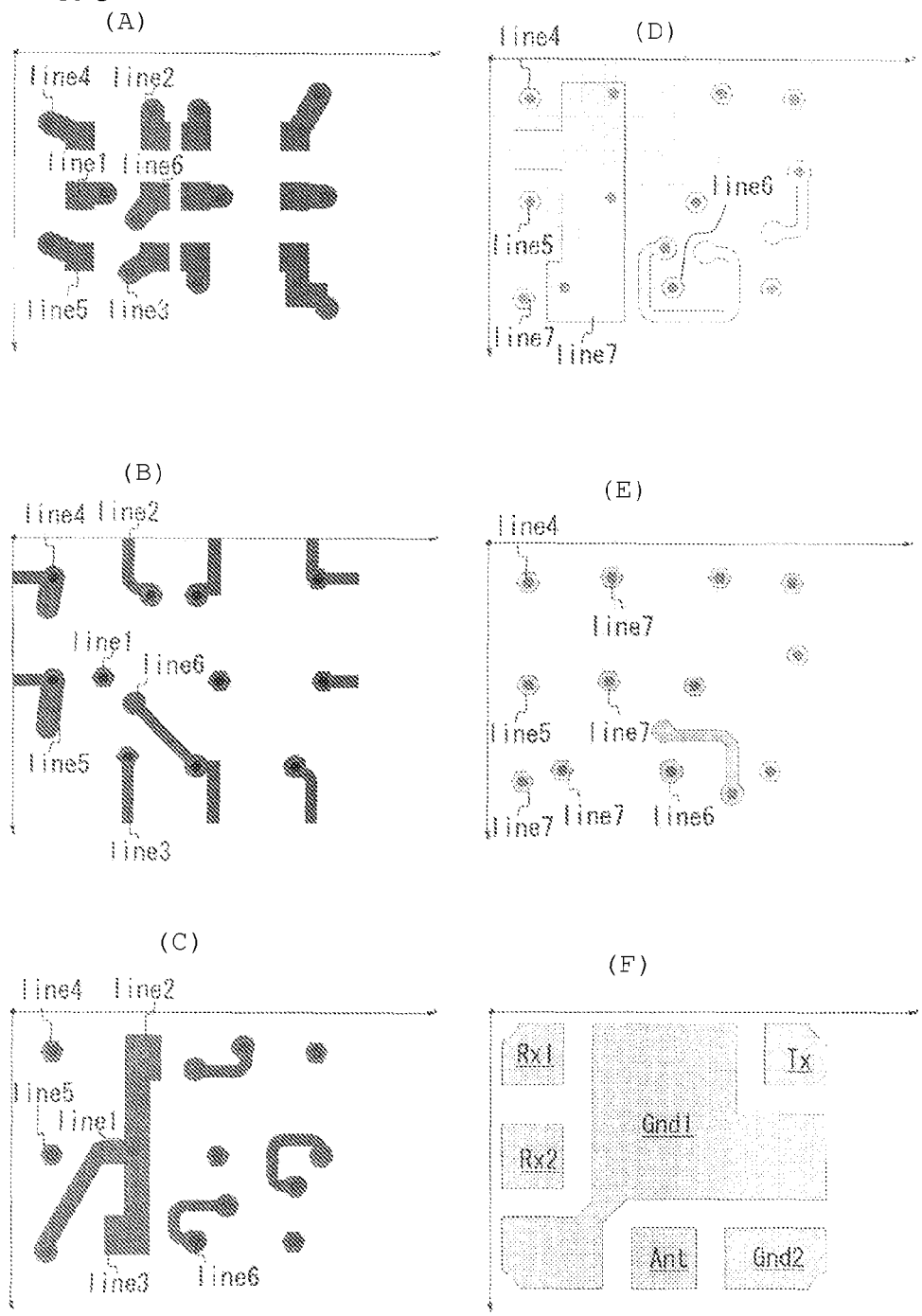

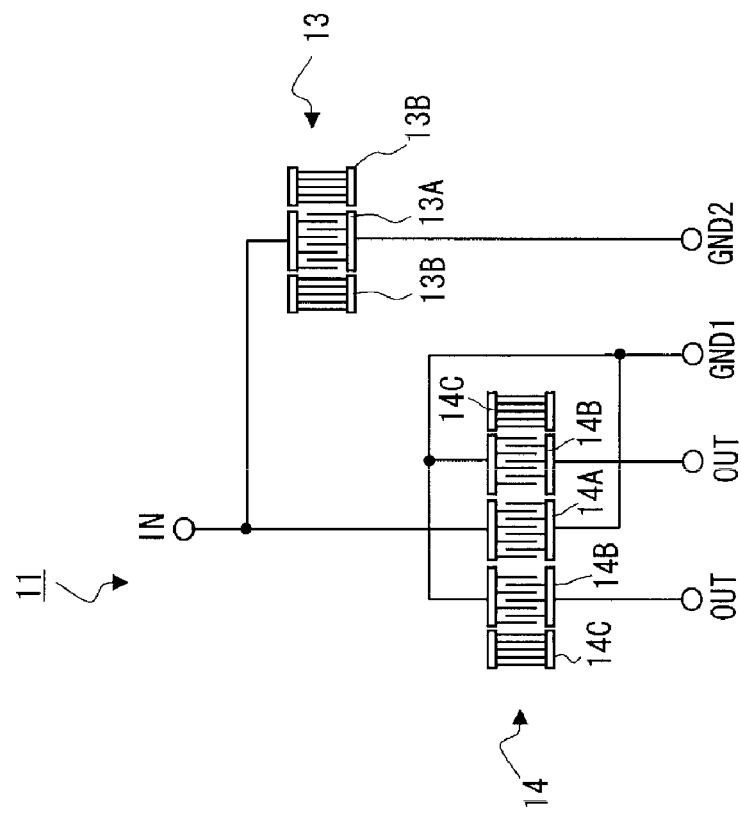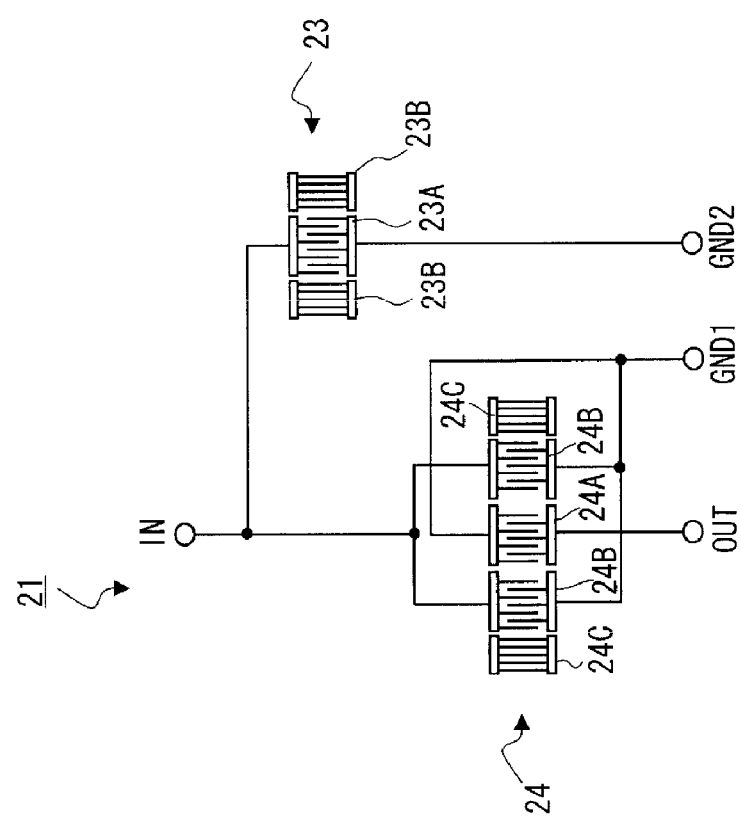

ELASTIC WAVE FILTER DEVICE AND MODULE INCLUDING THE SAME

BACKGROUND OF THE INVENTION

1. Field of the Invention

The present invention relates to an elastic wave filter device including an elastic wave filter and a parallel trap that are connected to each other in a ladder pattern on a piezoelectric substrate, and also relates to a module including the elastic wave filter device.

2. Description of the Related Art

Elastic wave filter devices that use electromechanical vibration, such as surface elastic waves using vibration on a surface of a piezoelectric substrate, bulk acoustic waves using vibration inside a piezoelectric substrate, and boundary acoustic waves using vibration on an interface of a laminated piezoelectric substrate, are used for RF filters or the like of mobile phone apparatuses.

An example of the elastic wave filter device includes a device in which a plurality of one-port elastic wave resonators (hereinafter simply referred to as resonators) are arranged in an elastic wave propagation direction and are longitudinally coupled to form a multi-mode filter, and trap resonators are inserted into the multi-mode filter in series and in parallel to form a ladder-pattern connection (e.g., see Japanese Unexamined Patent Application Publication No. 7-131290).

FIG. 1 is a circuit diagram illustrating an example configuration of a conventional elastic wave filter device.

This elastic wave filter device includes a multi-mode filter 111, which is made up of a plurality of resonators 105 and a plurality of resonators 106, and also includes series trap resonators 101, 102, 107, and 108 and parallel trap resonators 103, 104, 109, and 110.

In the plurality of resonators 105, individual first IDT electrodes are connected to input lines, and individual second IDT electrodes are connected to ground lines. In the plurality of resonators 106, individual first IDT electrodes are connected to output lines, and individual second IDT electrodes are connected to ground lines. The plurality of resonators 105 and 106 are alternately arranged in an elastic wave propagation direction and are longitudinally coupled, thereby forming the multi-mode filter 111.

The series trap resonators 101 and 102 are inserted in series into an input line, and the series trap resonators 107 and 108 are inserted in series into an output line. The parallel trap resonators 103 and 104 are inserted in parallel between input lines and ground lines, and the parallel trap resonators 109 and 110 are inserted in parallel between output lines and ground lines.

Such an elastic wave filter device is normally formed as a chip that is integrally provided on a piezoelectric substrate. The chip of this elastic wave filter device is mounted on a module body, such as a ceramic substrate or a printed board, so as to be formed as a module. At that time, it is difficult to separately provide the ground connection electrodes represented by the plurality of ground symbols illustrated in FIG. 1 on the surface of the piezoelectric substrate in view of the limited chip size. Thus, as illustrated in the schematic view in FIG. 2, all the ground lines are commonly connected to a single ground connection electrode.

In a case where an elastic wave filter device has a module structure, the wiring on a module body extending from external terminals of the module to the elastic wave filter device has a parasitic impedance.

Therefore, a ground connection electrode provided on a surface of a piezoelectric substrate is connected to an external ground terminal of the module via the parasitic impedance. However, the effect of the parasitic impedance may degrade the attenuation characteristic and isolation characteristic of an elastic wave filter.

SUMMARY OF THE INVENTION

Preferred embodiments of the present invention provide an elastic wave filter device that prevents degradation of the attenuation characteristic and isolation characteristic of a filter, the degradation affecting the elastic wave filter device due to the effect of the parasitic impedance of connection wiring, and provide a module including the elastic wave filter device.

According to a preferred embodiment of the present invention, an elastic wave filter device includes an elastic wave filter and a parallel trap provided on a piezoelectric substrate, and a first ground connection electrode and a second ground connection electrode. The elastic wave filter includes input-side resonators and output-side resonators coupled to each other. Each of the input-side resonators is connected between an input line and at least one first ground line. Each of the output-side resonators is connected between an output line and at least one second ground line. The parallel trap is connected between at least one third ground line and the input line or the output line. The first ground connection electrode is provided on a surface of the piezoelectric substrate and is connected to the at least one first ground line and the at least one second ground line. The second ground connection electrode is provided on the surface of the piezoelectric substrate so as to be isolated from the first ground connection electrode and is connected to the at least one third ground line.

In this configuration, the plurality of resonators of the elastic wave filter are connected to the first ground connection electrode on the surface of the piezoelectric substrate, and the parallel trap is connected to the second ground connection electrode isolated from the first ground connection electrode. Thus, the parasitic impedance of connection wiring with respect to the first ground connection electrode commonly affects the plurality of resonators of the elastic wave filter. Also, the parasitic impedance of connection wiring with respect to the second ground connection electrode is independent of the parasitic impedance that affects the elastic wave filter and affects only the parallel trap.

Preferably, each of the input-side resonators and the output-side resonators includes a first IDT electrode connected to an input/output line and a second IDT electrode connected to a ground line. In that case, preferably, the input-side resonators and the output-side resonators are alternately arranged in an elastic wave propagation direction, the first IDT electrodes and the second IDT electrodes are arranged in a direction vertical to the elastic wave propagation direction, and the arrangement order of the first IDT electrodes and the second IDT electrodes in the input-side resonators is opposite to the arrangement order in the output-side resonators.

In such a configuration, the first IDT electrodes of the input-side resonators and the second IDT electrodes of the output-side resonators are arranged on both sides of the elastic wave filter. Thus, the circuit configuration is simplified by connecting the second IDT electrodes of the input-side resonators and the second IDT electrodes of the output-side resonators to different ground connection electrodes. In that case, however, degradation of the attenuation characteristic and isolation characteristic of the filter occurs due to the effect of parasitic impedance if the filter is integrated into a module. Therefore, even in the case of this configuration, it is preferable that the individual second IDT electrodes be connected to a common ground connection electrode.

A module according to a preferred embodiment of the present invention includes the above-described elastic wave filter device and a module body on which the elastic wave filter device is mounted. The module body may include, on a mounting surface thereof, a ground terminal connected to the first ground connection electrode and the second ground connection electrode.

According to various preferred embodiments of the present invention, the parasitic impedance caused by connection wiring with respect to the first ground connection electrode of the elastic wave filter device commonly affects the plurality of resonators of the elastic wave filter, and is independent of the parasitic impedance that affects the parallel trap. Accordingly, degradation of the attenuation characteristic and isolation characteristic of the filter is prevented.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 5 is an exploded view illustrating an example of an electrode pattern of electrode layers of the module illustrated in FIGS. 3A and 3B.

FIG. 8 is a circuit diagram of an example configuration of an elastic wave filter device according to a second preferred embodiment of the present invention.

FIG. 9 is a circuit diagram of an example configuration of an elastic wave filter device according to a third preferred embodiment of the present invention.

DETAILED DESCRIPTION OF THE PREFERRED EMBODIMENTS

Figure 1:
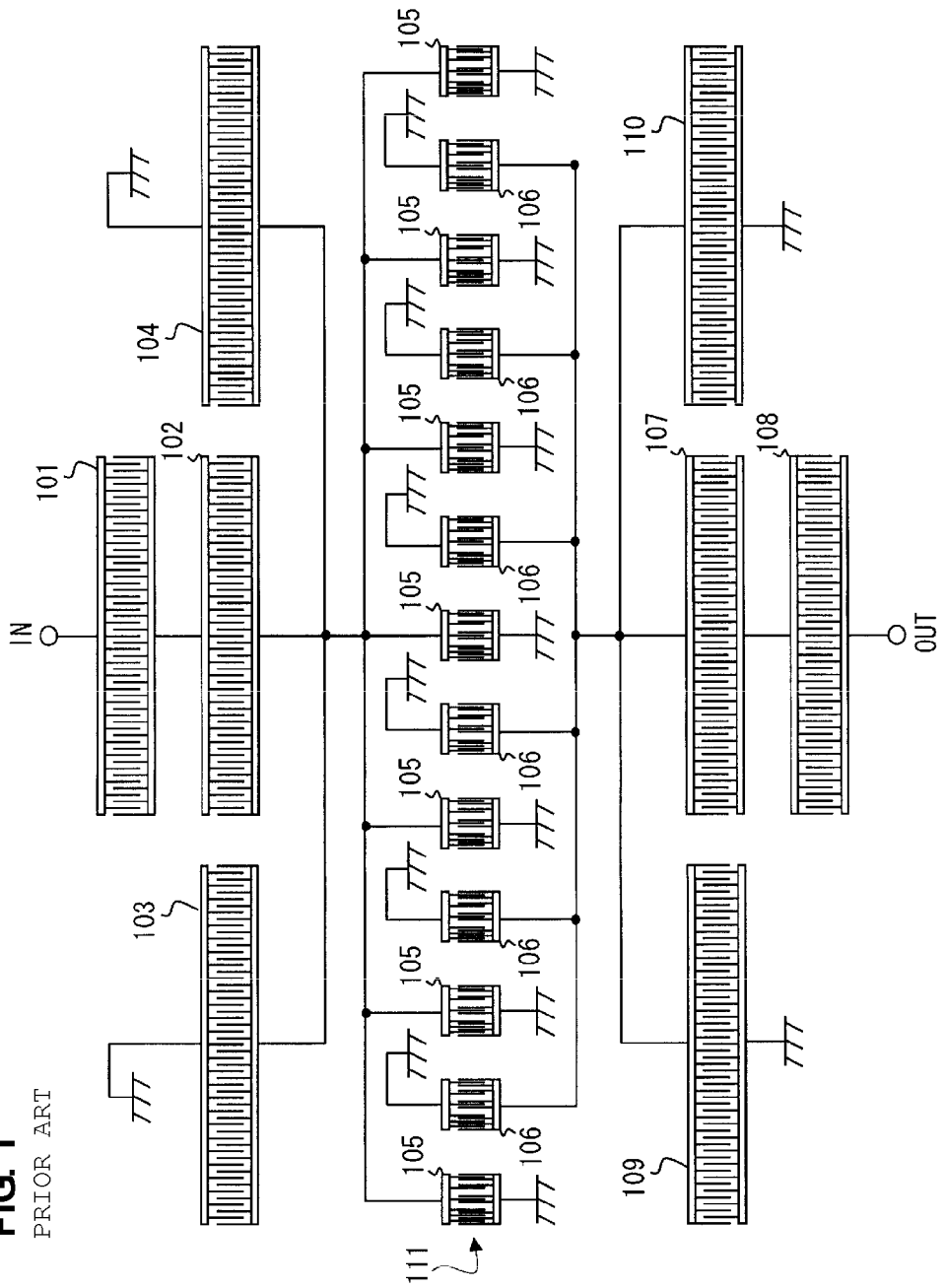
FIG. 1 is a diagram illustrating an example circuit of a conventional elastic wave filter device.
Figure 2:
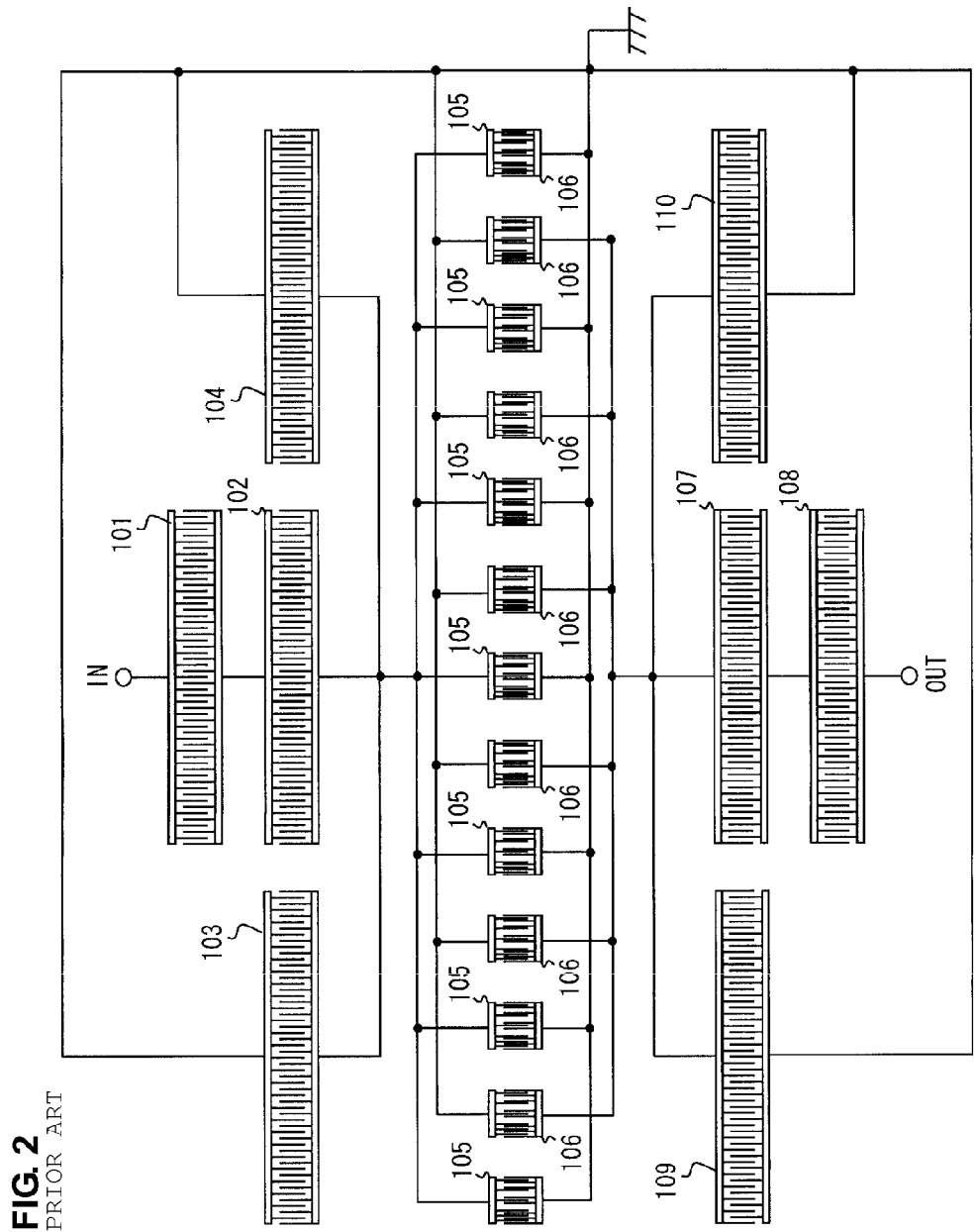
FIG. 2 is a diagram illustrating an example circuit of a conventional elastic wave filter device.
Figure 3A:
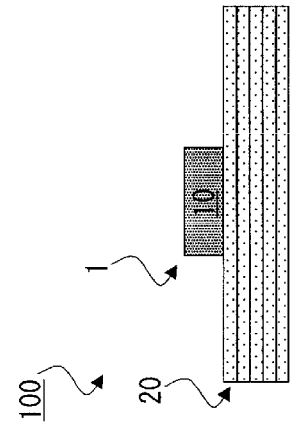
FIGS. 3A and 3B are a main portion cross-sectional view and a circuit diagram illustrating an example configuration of a module including an elastic wave filter device according to a first preferred embodiment of the present invention.
Figure 3B:
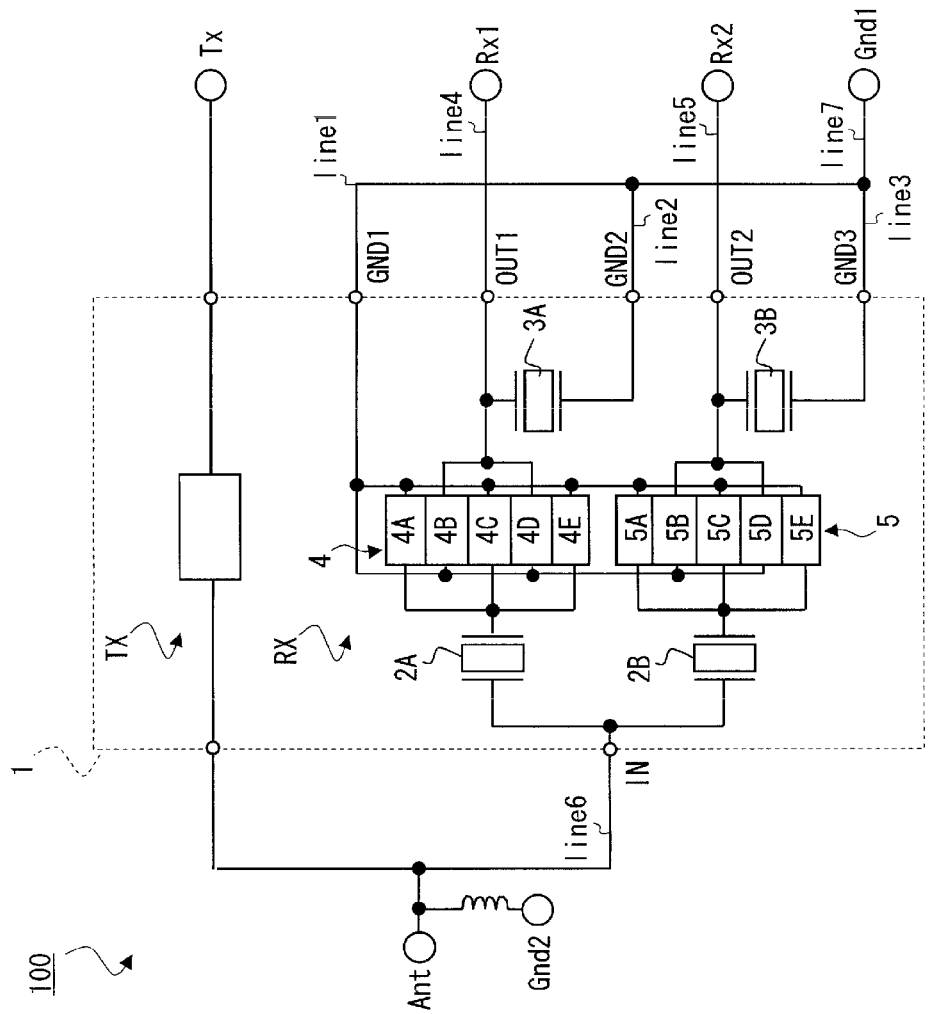

FIGS. 3A and 3B are diagrams illustrating a schematic configuration of a module including an elastic wave filter device according to a first preferred embodiment. FIG. 3A is a cross-sectional view of a main portion of the module, and FIG. 3B is a circuit diagram of the module.

The module 100 according to this preferred embodiment has a configuration in which a chip of an elastic wave filter device 1 is mounted on a module body 20, which is made up of a laminated substrate preferably having a five-layer structure. The module body 20 includes mounting terminals (described below) provided on a mounting surface opposite to a chip mounting surface, and internal wiring is arranged therein to connect the individual mounting terminals and the individual connection ports (connection electrodes) of the elastic wave filter device 1. The elastic wave filter device 1 is a chip of a SAW (surface acoustic wave) filter in which a transmission circuit TX and a reception circuit RX of a duplexer are provided on a circuit formation surface of a piezoelectric substrate 10. This chip is mounted on the module body 20 such that the circuit formation surface faces the module body 20, and the individual connection ports are connected to the electrodes of the module body 20 using bumps.

The transmission circuit TX preferably is an unbalanced input-unbalanced output type, and the connection port for transmission input of the transmission circuit TX is connected to a transmission input terminal Tx, which is a mounting terminal of the module body 20, via the internal wiring of the module body 20. The connection port for transmission output of the transmission circuit TX is connected to an antenna terminal Ant, which is a mounting terminal of the module body 20, via the internal wiring of the module body 20. The antenna terminal Ant is connected to a ground terminal Gnd2, which is a mounting terminal of the module body 20, via a coil provided as the internal wiring of the module body 20.

The reception circuit RX is a reception circuit of an unbalanced input-balanced output type (balun type), and includes elastic wave filters 4 and 5, series resonators 2A and 2B, and parallel resonators 3A and 3B, which serve as a circuit element unit. Also, the reception circuit RX includes a reception input port IN, reception output ports OUT1 and OUT2, and ground ports GND1, GND2, and GND3, which serve as connection ports.

The elastic wave filter 4 is a longitudinally coupled resonator SAW filter including five resonators 4A to 4E that are alternately arranged in an elastic wave propagation direction and are longitudinally coupled, and is connected between the reception input port IN and the reception output port OUT1. The elastic wave filter 5 is a longitudinally coupled resonator SAW filter including five resonators 5A to 5E that are alternately arranged in the elastic wave propagation direction and are longitudinally coupled, and is connected between the reception input port IN and the reception output port OUT2. The elastic wave filters 4 and 5 output signals with a phase difference, whereby the reception circuit RX obtains a balanced output.

Each of the resonators 4A, 4C, 4E, 5A, 5C, and 5E is an input-side resonator, and includes a first IDT electrode (not illustrated) connected to an input line and a second IDT electrode (not illustrated) connected to a ground line. Each of the resonators 4B, 4D, 5B, and 5D is an output-side resonator, and includes a first IDT electrode (not illustrated) connected to an output line and a second IDT electrode (not illustrated) connected to a ground line. The ground lines connected to the respective resonators 4A to 4E and 5A to 5E are commonly connected to the ground port GND1, which is a first ground connection electrode according to a preferred embodiment of the present invention. The output lines connected to the resonators 4B and 4D are commonly connected to the reception output port OUT1. The output lines connected to the resonators 5B and 5D are commonly connected to the reception output port OUT2.

The series resonator 2A is inserted in series into an input line of the elastic wave filter 4, and the series resonator 2B is inserted in series into an input line of the elastic wave filter 5. Each of the series resonators 2A and 2B functions as a series trap. These input lines are commonly connected to the reception input port IN.

The parallel resonator 3A is inserted into a parallel line that branches from an output line of the elastic wave filter 4 and functions as a parallel trap. This parallel line is connected to the ground port GND2, which is a second ground connection electrode according to a preferred embodiment of the present invention. The parallel resonator 3B is inserted into a parallel line that branches from an output line of the elastic wave filter 5 and functions as a parallel trap. This parallel line is connected to the ground port GND3, which is the second ground connection electrode according to a preferred embodiment of the present invention.

The reception input port IN is connected to the antenna terminal Ant, which is a mounting terminal of the module body 20, via a reception input wiring line6 in the module body 20. The reception output ports OUT1 and OUT2 are connected to reception output terminals Rx1 and Rx2, which are mounting terminals of the module body 20, via reception output wirings line4 and line5 in the module body 20. The ground ports GND1, GND2, and GND3 are connected to a ground wiring line7 in the module body 20 via ground wirings line1, line2, and line3 in the module body 20, and are connected to a ground terminal Gnd1, which is a mounting terminal of the module body 20, via the ground wiring line7.

In the elastic wave filter device 1 having the above-described configuration, all the ground lines connected to the elastic wave filters 4 and 5 are commonly connected to the ground port GND1 on the piezoelectric substrate 10. Also, the parallel line connected to the parallel resonator 3A is connected to the ground port GND2 and the parallel line connected to the parallel resonator 3B is connected to the ground port GND3 on the piezoelectric substrate 10.

Thus, the parasitic impedance of the ground wiring line1 of the module body 20 commonly affects all the resonators of the elastic wave filters 4 and 5. Also, the parasitic impedance of the ground wirings line2 and line3 of the module body 20 is independent of the parasitic impedance that affects the elastic wave filters 4 and 5. Accordingly, degradation of the attenuation characteristic and isolation characteristic of the filters is prevented.

Next, a specific example of the circuit pattern of the above-described elastic wave filter device 1 and the module 100 will be described.

Figure 4:
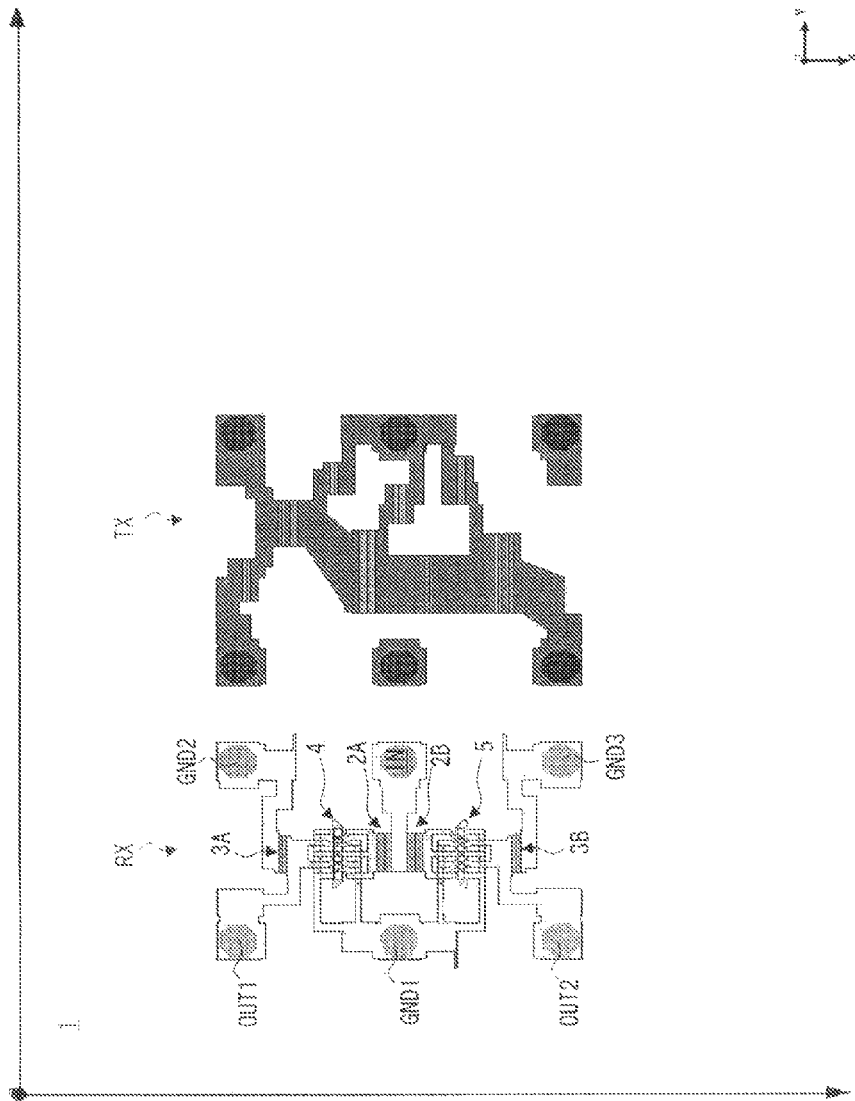
FIG. 4 is a bottom view illustrating an example of an electrode pattern on a circuit formation surface of the elastic wave filter device illustrated in FIGS. 3A and 3B.

FIG. 4 is a bottom view illustrating the circuit formation surface of the elastic wave filter device 1. FIG. 5 is an exploded view of electrode layers provided in the module body 20 viewed from the bottom.

The elastic wave filter device 1 has a circuit pattern serving as the reception circuit RX and the transmission circuit TX provided on the circuit formation surface of the piezoelectric substrate 10. Also, the circuit pattern serving as the reception circuit RX is provided with a plurality of IDT electrodes serving as the elastic wave filters 4 and 5, the series resonators 2A and 2B, and the parallel resonators 3A and 3B.

Each of the elastic wave filters 4 and 5 includes three input-side resonators and two output-side resonators, and the individual resonators are alternately arranged in the elastic wave propagation direction, which is the horizontal direction in the figure. Also, each of the resonators includes a first IDT electrode connected to an input/output line and a second IDT electrode connected to a ground line. The first IDT electrodes and the second IDT electrodes are arranged in a direction vertical to the elastic wave propagation direction, which is the vertical direction in the figure. In the input-side resonators, the first IDT electrode is arranged on the center side of the substrate and the second IDT electrode is arranged on the upper end side of the substrate (or on the lower end side of the substrate). In the output-side resonators, the arrangement order is opposite.

Also, this circuit pattern includes an electrode portion serving as the reception input port IN, an electrode portion serving as the reception output port OUT1, an electrode portion serving as the reception output port OUT2, an electrode portion serving as the ground port GND1, an electrode portion serving as the ground port GND2, and an electrode portion serving as the ground port GND3. The electrodes corresponding to these respective connection ports are connected to the electrodes of the module body 20 via bump electrodes.

The module body 20 preferably includes six electrode layers (A) to (F), for example, in order from the chip mounting surface to the mounting surface.

The electrode layer (A) is provided on the chip mounting surface of the module body 20 and includes a plurality of electrodes on which the respective connection ports of the elastic wave filter device 1 are mounted. Specifically, the electrode layer (A) includes an electrode on which the reception input port IN of the reception circuit RX is mounted and which defines the reception input wiring line6, an electrode on which the reception output port OUT1 is mounted and which defines the reception output wiring line4, an electrode on which the reception output port OUT2 is mounted and which defines the reception output wiring line5, an electrode on which the ground port GND1 is mounted and which defines the ground wiring line1, an electrode on which the ground port GND2 is mounted and which defines the ground wiring line2, an electrode on which the ground port GND3 is mounted and which defines the ground wiring line3, and a plurality of electrodes to which the respective connection ports of the transmission circuit TX are connected.

The electrode layer (B) is disposed between the first-layer substrate and the second-layer substrate among the laminated substrates of the module body 20 and includes a plurality of electrodes connected to the respective electrodes of the electrode layer (A) via through holes. Specifically, the electrode layer (B) includes an electrode which defines the reception input wiring line6 of the reception circuit RX, an electrode which defines the reception output wiring line4, an electrode which defines the reception output wiring line5, an electrode which defines the ground wiring line1, an electrode which defines the ground wiring line2, an electrode which defines the ground wiring line3, and a plurality of electrodes defining the internal wiring of the transmission circuit TX.

The electrode layer (C) is provided between the second-layer substrate and the third-layer substrate among the laminated substrates of the module body 20 and includes a plurality of electrodes connected to the respective electrodes of the electrode layer (B) via through holes. Specifically, the electrode layer (C) includes an electrode which defines the reception input wiring line6 of the reception circuit RX, an electrode which defines the reception output wiring line4, an electrode which defines the reception output wiring line5, an internal ground connection electrode which connects the ground wiring line1, the ground wiring line2, and the ground wiring line3, and a plurality of electrodes defining the internal wiring of the transmission circuit TX.

The electrode layer (D) is provided between the third-layer substrate and the fourth-layer substrate among the laminated substrates of the module body 20 and includes a plurality of electrodes connected to the respective electrodes of the electrode layer (C) via through holes. Specifically, the electrode layer (D) includes an electrode which defines the reception input wiring line6 of the reception circuit RX, an electrode which defines the reception output wiring line4, an electrode which defines the reception output wiring line5, an internal ground connection electrode which is connected to the internal ground connection electrode of the electrode layer (C) and which defines the ground wiring line7, and a plurality of electrodes serving as the internal wiring of the transmission circuit TX.

The electrode layer (E) is provided between the fourth-layer substrate and the fifth-layer substrate among the laminated substrates of the module body 20 and includes a plurality of electrodes connected to the respective electrodes of the electrode layer (D) via through holes. Specifically, the electrode layer (E) includes an electrode which defines the reception input wiring line6 of the reception circuit RX, an electrode which defines the reception output wiring line4, an electrode which defines the reception output wiring line5, a plurality of electrodes which define the ground wiring line7, and a plurality of electrodes defining the internal wiring of the transmission circuit TX.

The electrode layer (F) is provided on the mounting surface of the module body 20 and includes a plurality of mounting terminals. Specifically, the electrode layer (F) includes the antenna terminal Ant to which the reception input wiring line6 of the reception circuit RX is connected, the reception output terminal Rx1 to which the reception output wiring line4 is connected, the reception output terminal Rx2 to which the reception output wiring line5 is connected, the ground terminal Gnd1 to which the ground wiring line7 is connected, the transmission input terminal Tx of the transmission circuit TX, and the ground terminal Gnd2. The ground terminal Gnd2 allows the antenna terminal Ant to be grounded via the coil-shaped internal wiring that branches in the electrode layer (C) from the reception input wiring line6 connected to the antenna terminal Ant and that is provided in the electrode layers (C) to (E).

In the case of the above-described example of the circuit pattern, the parasitic impedance caused by the bump electrodes used for connection with the module body 20 side, the ground wiring line1 in the electrode layers (A) to (B), and the through holes extending from the first-layer substrate to the third-layer substrate affects the ground port GND1 connected to the elastic wave filters 4 and 5 of the elastic wave filter device 1. Also, the parasitic impedance caused by the bump electrodes used for connection with the module body 20 side, the ground wiring line2 in the electrode layers (A) to (B), and the through holes extending from the first-layer substrate to the third-layer substrate affects the ground port GND2 connected to the parallel resonator 3A of the elastic wave filter device 1. Also, the parasitic impedance caused by the bump electrodes used for connection with the module body 20 side, the ground wiring line3 in the electrode layers (A) to (B), and the through holes extending from the first-layer substrate to the third-layer substrate affects the ground port GND3 connected to the parallel resonator 3B of the elastic wave filter device 1.

In this example of the circuit pattern, internal ground connection electrodes arranged to connect the ground wirings line1, line2, and line3 are provided in the electrode layers (C) and (D), and these internal ground connection electrodes are connected to the ground terminal Gnd1 in the electrode layer (F) using a plurality of ground wirings line7. Accordingly, the parasitic impedance caused by the ground wirings line7 in the electrode layers (C) to (F) and the through holes extending from the fourth-layer substrate to the fifth-layer substrate hardly affects the ground ports GND1, GND2, and GND3 of the elastic wave filter device 1, so that degradation of the attenuation characteristic and isolation characteristic of the filters is prevented.

Also, in this example of the circuit pattern, the ground ports GND1, GND2, and GND3 of the elastic wave filter device 1 preferably are not adjacent to one another and are diagonally opposite to one another. This arrangement further improves the isolation characteristic of the filters.

Next, the filter characteristic of the above-described circuit pattern is compared with the filter characteristic of a circuit pattern having a comparative configuration on the basis of simulation.

Figure 6A:
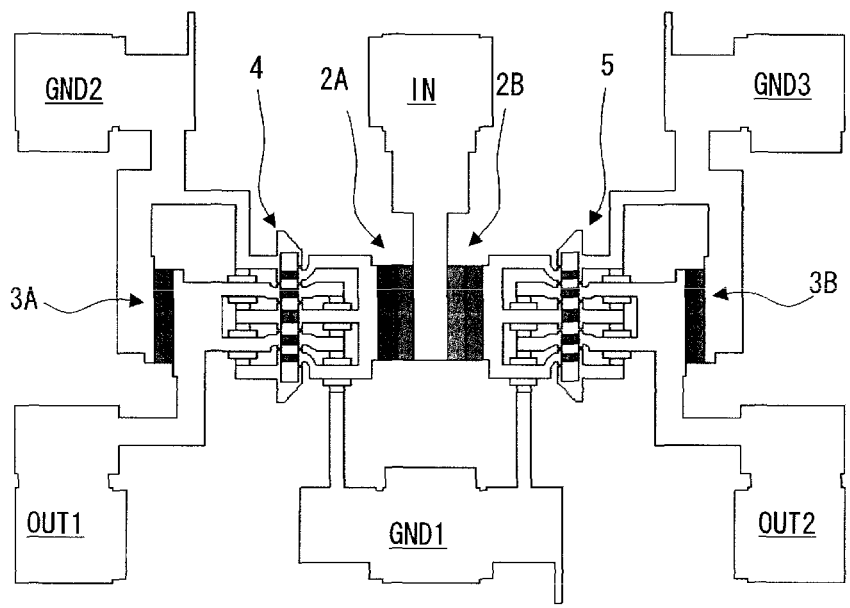
FIGS. 6A and 6B are diagrams illustrating examples of electrode patterns on circuit formation surfaces of elastic wave filter devices used for simulation.
Figure 6B:
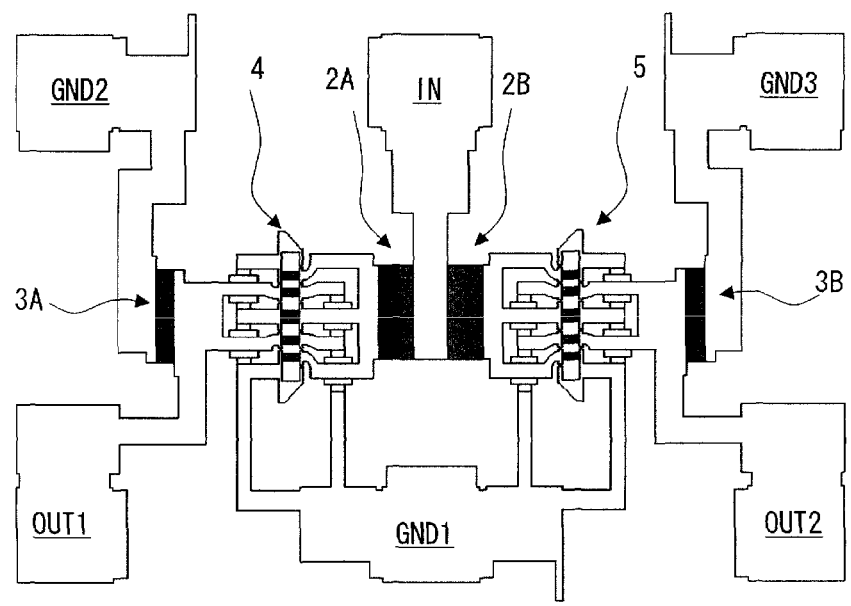

FIG. 6A is a diagram illustrating a reception circuit according to an example of a circuit pattern having a comparative configuration, and FIG. 6B is a diagram illustrating a reception circuit according to an example of a circuit pattern having this configuration.

In the circuit pattern having the comparative configuration illustrated in FIG. 6A, the configuration is different from that of the circuit pattern having this configuration illustrated in FIG. 6B in that the second IDT electrodes (on the outer side of the substrate) of the input-side resonators of the elastic wave filters 4 and 5 are connected to the electrode portions serving as the ground ports GND2 and GND3, not to the ground port GND1.

Figure 7:
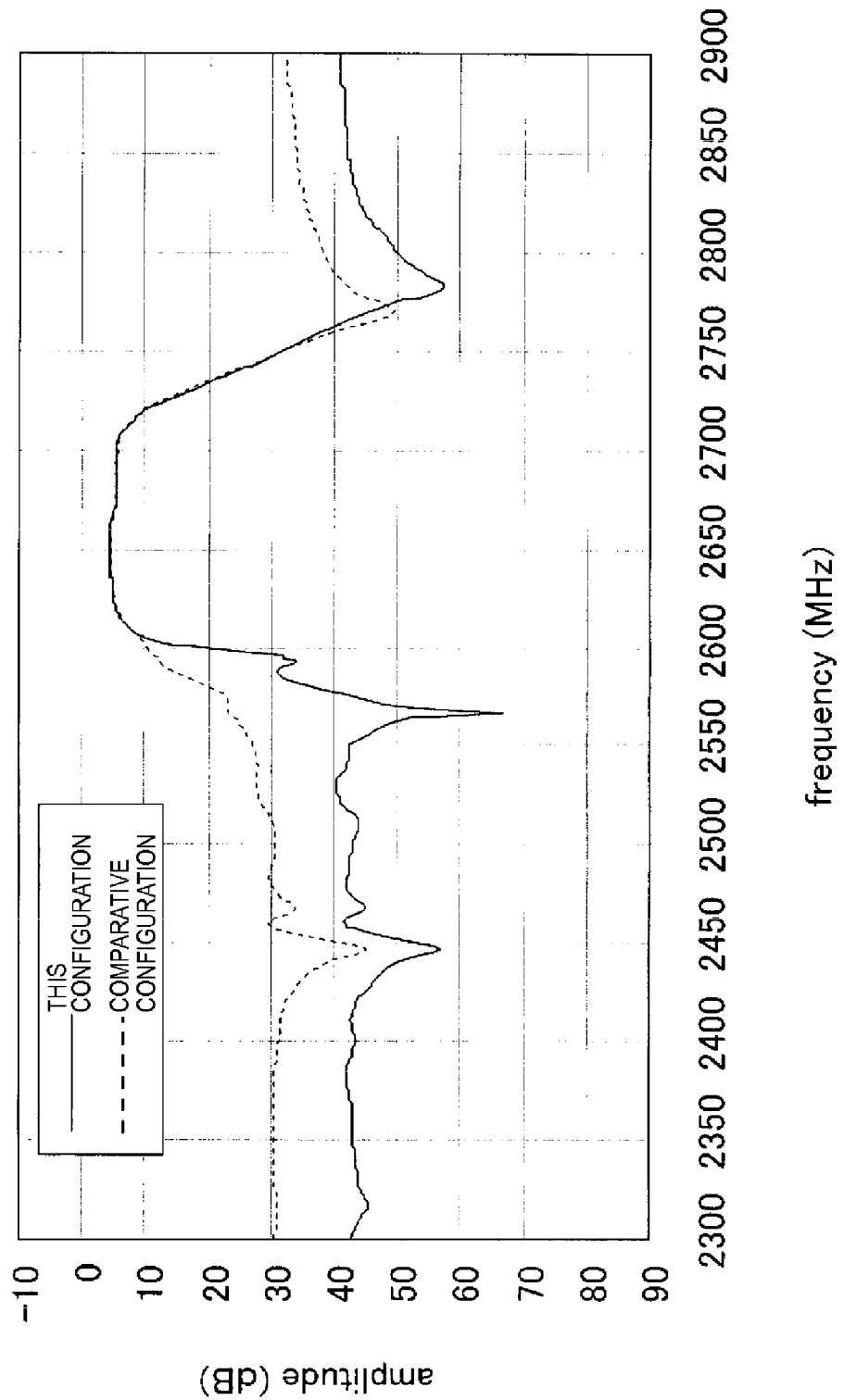
FIG. 7 is a diagram illustrating simulated filter characteristics.

FIG. 7 is a diagram for comparing the filter characteristic of this configuration with the filter characteristic of the comparative configuration.

As illustrated in this figure, in this configuration, the amplitude can be suppressed to about −40 dB or less in most of the region of a low-frequency band and a high-frequency band of the passband, and a large attenuation amount can be acquired. On the other hand, in the comparative configuration, the frequencies of the passband and the characteristic waveform are almost the same as those of this configuration, but it is difficult to acquire an attenuation amount as a whole, and the amplitude can be suppressed to only about −25 dB or less in most of the region of a low-frequency band and a high-frequency band of the passband.

As described above, in the module 100 including the elastic wave filter device 1 according to this preferred embodiment, the parasitic impedance caused by the connection wiring on the module side commonly affects the plurality of resonators of the elastic wave filters 4 and 5 via the ground port GND1 of the elastic wave filter device 1. Furthermore, the parasitic impedance affects the resonators separately from the parasitic impedance that affects the parallel resonators 3A and 3B. Accordingly, degradation of the attenuation characteristic and isolation characteristic of the filters is prevented.

In this preferred embodiment, the elastic wave filters 4 and 5 preferably are provided, and the individual ground lines thereof preferably are commonly connected to the ground port GND1. Alternatively, the ground lines of the input-side resonators and the ground lines of the output-side resonators of the individual elastic wave filters may be connected to common ground ports, respectively, in order to carry out the present invention. Alternatively, the elastic wave filters 4 and 5 may be connected to different ground ports.

Also, according to the example described here, each of the elastic wave filters 4 and 5, the series resonators 2A and 2B, and the parallel resonators 3A and 3B is preferably constituted by a surface acoustic wave device. Alternatively, the present invention can be preferably carried out by using a boundary acoustic wave device or a bulk acoustic wave device.

Also, according to the example described here, each of the elastic wave filters 4 and 5 preferably has a configuration of a longitudinally coupled resonator device. Alternatively, the present invention can be preferably carried out by using a device of any coupled type as long as IDT electrodes connected to ground lines are provided therein.

Next, an elastic wave filter device according to a second preferred embodiment of the present invention will be described.

An elastic wave filter device 11 is a chip of a longitudinally coupled SAW filter of an unbalanced input-balanced output type, and includes an elastic wave filter 14 and a parallel trap 13 defining a circuit element unit. Also, the elastic wave filter device 11 includes an unbalanced input port IN, balanced output ports OUT, and ground ports GND1 and GND2, serving as connection ports.

The elastic wave filter 14 is connected between the unbalanced input port IN and the balanced output ports OUT, and includes one input-side resonator 14A, two output-side resonators 14B, and two reflectors 14C. In the input-side resonator 14A, one of the IDT electrodes is connected to an input line extending from the unbalanced input port IN, and the other IDT electrode is connected to a ground line extending from the ground port GND1. The output-side resonators 14B are disposed on both sides of the input-side resonator 14A, one of the IDT electrodes thereof is connected to an output line extending from the balanced output port OUT, and the other IDT electrode is connected to the ground line extending from the ground port GND1. The reflectors 14C are disposed on both sides of the resonators 14A and 14B.

The parallel trap 13 is connected between the unbalanced input port IN and the ground port GND2 and includes a resonator 13A and reflectors 13B. In the resonator 13A, one of the IDT electrodes is connected to the input line extending from the unbalanced input port IN, and the other IDT electrode is connected to a ground line extending from the ground port GND2.

In this configuration, all the ground lines connected to the elastic wave filter 14 are connected to the single ground port GND1 separately from the parallel trap 13. Thus, the parasitic impedance that affects the ground port GND1 commonly affects all the resonators of the elastic wave filter 14. Also, the parasitic impedance that affects the ground port GND2 is independent of the parasitic impedance that affects the elastic wave filter 14. Thus, degradation of the attenuation characteristic and isolation characteristic of the filter is prevented.

Next, an elastic wave filter device according to a third preferred embodiment of the present invention will be described.

An elastic wave filter device 21 is a chip of a longitudinally coupled SAW filter of an unbalanced input-unbalanced output type, and includes an elastic wave filter 24 and a parallel trap 23 serving as a circuit element unit. Also, the elastic wave filter device 21 includes an unbalanced input port IN, an unbalanced output port OUT, and ground ports GND1 and GND2, serving as connection ports.

The elastic wave filter 24 is connected between the unbalanced input port IN and the unbalanced output port OUT, and includes two input-side resonators 24B, one output-side resonator 24A, and two reflectors 24C. The input-side resonators 24B are disposed on both sides of the output-side resonator 24A, one of the IDT electrodes thereof is connected to an input line extending from the unbalanced input port IN, and the other IDT electrode is connected to a ground line extending from the ground port GND1. In the output-side resonator 24A, one of the IDT electrodes is connected to an output line extending from the unbalanced output port OUT, and the other IDT electrode is connected to the ground line extending from the ground port GND1. The reflectors 24C are disposed on both sides of the resonators 24A and 24B.

The parallel trap 23 is connected between the unbalanced input port IN and the ground port GND2 and includes a resonator 23A and reflectors 23B. In the resonator 23A, one of the IDT electrodes is connected to the input line extending from the unbalanced input port IN, and the other IDT electrode is connected to a ground line extending from the ground port GND2.

In this configuration, all the ground lines connected to the elastic wave filter 24 are connected to the single ground port GND1 separately from the parallel trap 23. Thus, the parasitic impedance that affects the ground port GND1 commonly affects all the resonators of the elastic wave filter 24. Also, the parasitic impedance that affects the ground port GND2 is independent of the parasitic impedance that affects the elastic wave filter 24. Thus, degradation of the attenuation characteristic and isolation characteristic of the filter is prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave filter device comprising:
    an elastic wave filter including an input-side resonator coupled to an output-side resonator, the input-side resonator being connected between an input line and at least one first ground line, the output-side resonator being connected between an output line and at least one second ground line;
    a parallel trap connected between at least one third ground line and the input line or the output line; and
    a piezoelectric substrate including the elastic wave filter and the parallel trap provided thereon; wherein
    the elastic wave filter device includes:
        a first ground connection electrode that is provided on a surface of the piezoelectric substrate and that is connected to the at least one first ground line and the at least one second ground line; and
        a second ground connection electrode that is provided on the surface of the piezoelectric substrate so as to be isolated from the first ground connection electrode and that is connected to the at least one third ground line;
    the parallel trap is defined by a resonator including a pair of comb-shaped electrodes;
    one of the pair of comb-shaped electrodes is connected to the input line or the output line and the other one of the pair of the comb-shaped electrodes is connected to the at least one third ground line; and
    the first ground connection electrode is disposed along a first side of the piezoelectric substrate and the second ground connection electrode is disposed along a second side of the piezoelectric substrate opposite to the first side of the piezoelectric substrate.

2. The elastic wave filter device according to claim 1, wherein the input-side resonator and the output-side resonator are alternately arranged in an elastic wave propagation direction, and a direction in which the input-side resonator is connected to the at least one first ground line is opposite to a direction in which the output-side resonator is connected to the at least one second ground line.

3. A module comprising:
    elastic wave filter device according to claim 1; and
    a module body on which the elastic wave filter device is mounted; wherein
    the module body includes, on a mounting surface thereof, a ground terminal connected to the first ground connection electrode and the second ground connection electrode.

* * * * *